United States Patent [19]
Adams et al.

[11] Patent Number: 5,085,887
[45] Date of Patent: Feb. 4, 1992

[54] WAFER REACTOR VESSEL WINDOW WITH PRESSURE-THERMAL COMPENSATION

[75] Inventors: David V. Adams; Roger N. Anderson, both of San Jose, Calif.

[73] Assignee: Applied Materials, Inc., Santa Clara, Calif.

[21] Appl. No.: 579,741

[22] Filed: Sep. 7, 1990

[51] Int. Cl.$^5$ .................. C23C 16/48; C23C 16/56
[52] U.S. Cl. .................. 427/55; 427/248.1; 118/620; 118/715; 118/719; 118/725; 118/733; 118/724
[58] Field of Search ............ 118/715, 719, 724, 725, 118/733, 620, 55; 427/248.1

[56] References Cited

U.S. PATENT DOCUMENTS

| | | |
|---|---|---|
| 3,721,210 | 3/1973 | Helms et al. ............ 118/725 |
| 4,920,918 | 5/1990 | Adams et al. ............ 118/725 |
| 4,958,061 | 9/1990 | Wakabayashi et al. ...... 118/725 |
| 5,000,113 | 3/1991 | Wang et al. ............. 118/725 |

Primary Examiner—Michael Lusignan
Assistant Examiner—Margaret Burke
Attorney, Agent, or Firm—Paul Hentzel

[57] ABSTRACT

A quartz window for a wafer reactor vessel has a flat bow for withstanding the pressure differential between the ambient outside pressure and the reduced pressure in the wafer chamber. The bow is enhanced at elevated operating temperatures to compensate for the flattening effect of higher pressure differentials. The enhanced bowing is provided by a rigid peripheral flange which radially confines the window. The thermal expansion within the window is not expressed radially, but is directed outward to increase the bow.

24 Claims, 3 Drawing Sheets

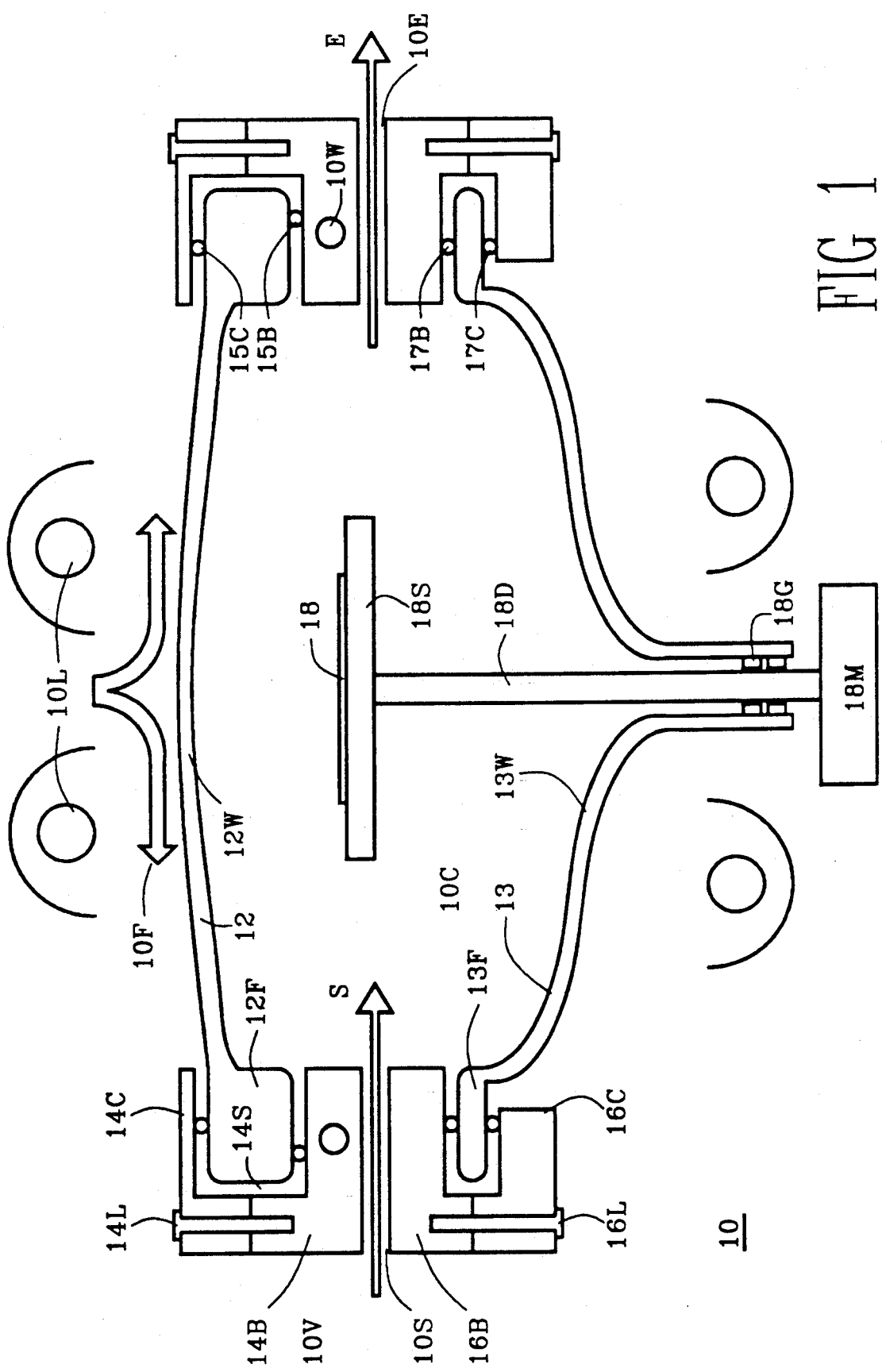

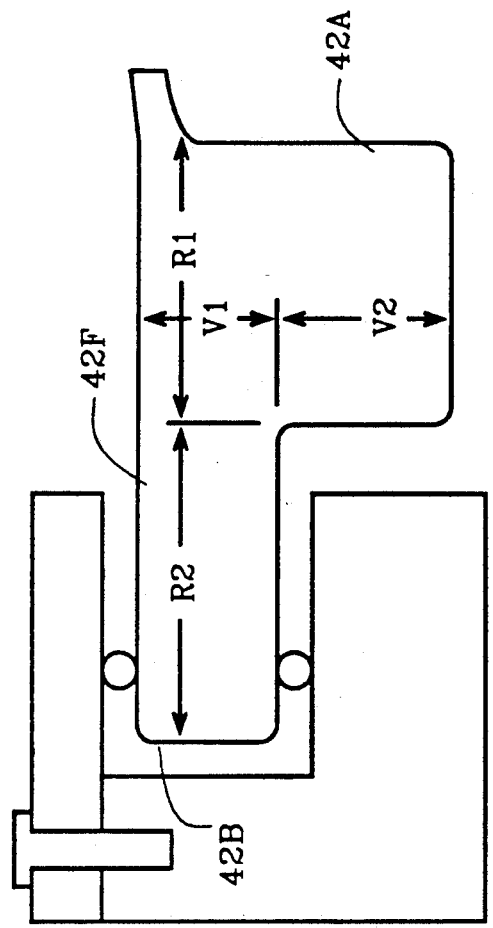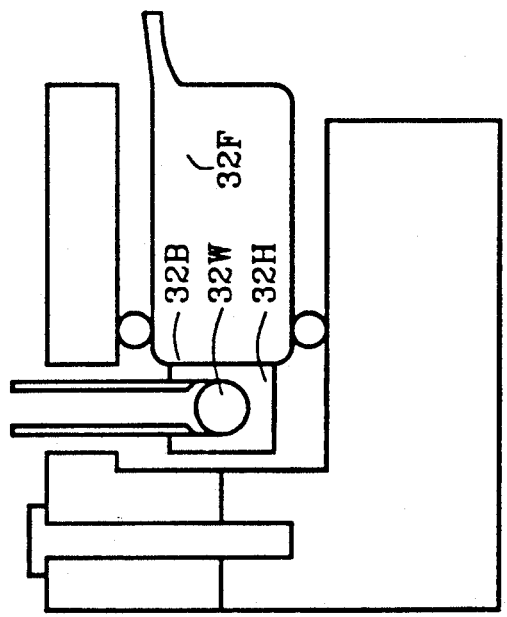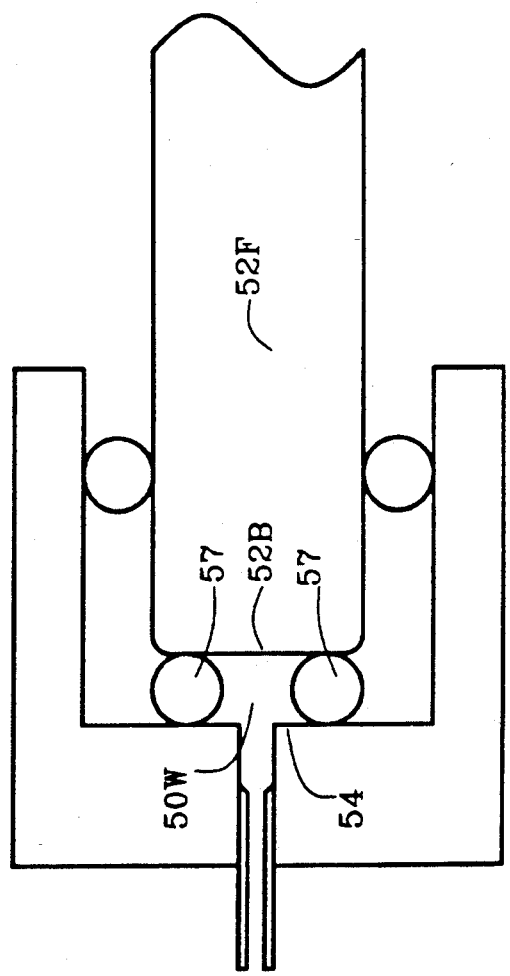
FIG. 4
FIG. 3
FIG. 5

WAFER REACTOR VESSEL WINDOW WITH PRESSURE-THERMAL COMPENSATION

TECHNICAL FIELD

This invention relates to thermal reactors for processing semiconductor wafers, and more particularly to such reactors having radiation transparent windows with pressure-thermal compensation.

BACKGROUND

Thermal reactors are heated by external lamps which pass infra-red radiations into the reactor chamber through heating ports. Quartz windows covering the ports are transparent to the radiations, and peripherally sealed to prevent reactant gas leaks into the ambient environment.

Flat windows provide a uniform space between the wafer and the inside surface of the window for promoting the orderly flow of reactant gas over the window and uniform deposition of the reactant material onto the wafer. Flat windows are therefore desirable, especially when the reactant gas within the chamber is maintained at about the same pressure as the ambient gas outside the chamber.

However, the reactant gas is frequently maintained at a pressure below ambient creating a pressure differential across the quartz window. Dome shaped covers having an outward bow are employed for opposing the inward compressive force of the ambient gas.

Prior reactor vessels have two sets of interchangeable windows. Flat windows for ambient chamber pressure applications, and domed windows for reduced chamber pressure applications. The reactor must be taken out of production and "opened up" in order to change the window. The resulting "down time" can be extensive because of the complexity of the window changing task. First the system must be cooled downed to room temperature and brought up to ambient pressure, and purged with inert gas. The clamping bolts must be removed, the windows exchanged, and the clamping bolts replaced and torqued. The system must then be purged with HCL at high temperature to remove particulate matter, and "baked out" to drive moisture from the susceptor and the quartz.

Individual reactor vessels may be installed as one of a bank of reactors on a common operation platform. In order to change the window on any one of these individual reactor vessels, the entire bank of reactors must be taken out of production.

Anderson et al (pending U.S. application Ser. No. 07/491,416 filed Mar. 9, 1990 by the present assignee) shows a wafer reactor vessel with opposed quartz covers mounted over upper and lower heating ports. Adams et al (U.S. Pat. No. 4,920,918) issued on May 1, 1990 shows an elongated bowed quartz chamber with open ends.

SUMMARY

It is an object of this invention to provide an improved window cover member for reactor vessels.

It is another object of this invention to provide such a cover member in which the window portion has a flat bow suitable for both reduced pressure and ambient pressure applications.

It is a further object of this invention to provide a window portion having a flat bow by maximizing the radius of curvature of the window portion.

It is a further object of this invention to provide such a cover member in which the window portion has pressure-thermal compensation.

It is a further object of this invention to provide such a window cover in which a radial flange portion confines thermal expansion of the central window portion.

Briefly, these and other objects of the present invention are accomplished by providing a reactor for processing semiconductor wafers at an elevated temperature in a processing gas at a reduced pressure. The reactor vessel has a wafer chamber and a heating port. A radiant energy heater outside of the reactor vessel provides radiating energy through the heating port into the chamber to elevate the temperature of the wafer. Processing gas is introduced into the chamber and evacuated from the chamber. A cover member is mounted over the heating port, and has a central window portion and a peripheral flange portion. The central window portion is formed of a material which is generally transparent to the radiant energy from the heating means for passing the radiant energy into the chamber. The central window portion has an outward bow defining a convex outside surface and a concave inside surface for opposing the compressive force created by the reduced pressure within the chamber. The peripheral flange portion supports the window portion, and radially confines the window portion in response to thermal expansion within the window portion for enhancing the outward bow of the window portion.

BRIEF DESCRIPTION OF THE DRAWING

Further objects and advantages of the cover member and the pressure-thermal compensation will become apparent from the following detailed description and drawing in which:

FIG. 1 is a section view of a thermal reactor showing the reactor vessel and a wafer cover member;

FIG. 3 is a sectional view of a hoop embodiment of the peripheral flange;

FIG. 4 is a sectional view of an increased mass embodiment of the peripheral flange; and FIG. 5 is a sectional view of a fluid cooled embodiment of the peripheral flange.

Figure 2A:
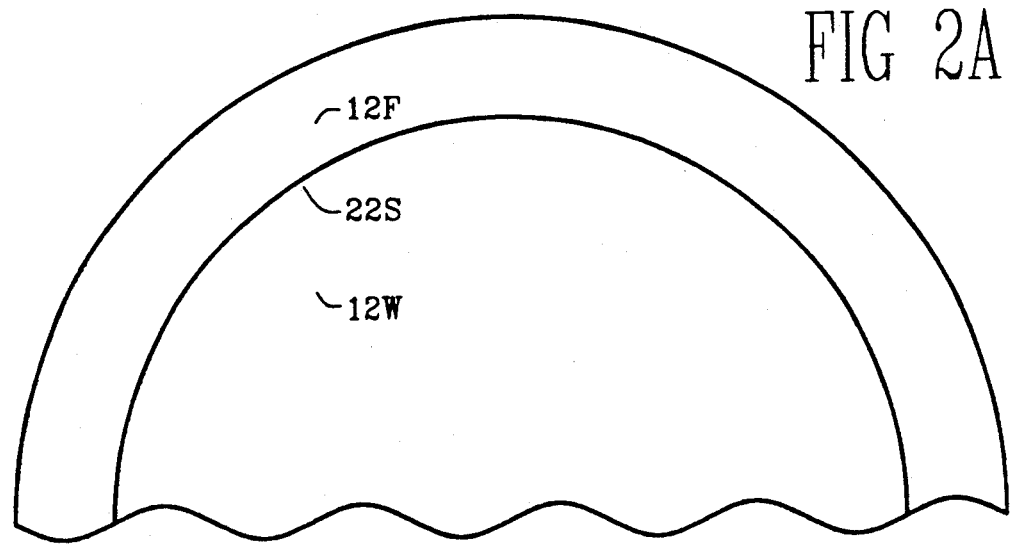
FIG. 2A is a fragmentary top view of a wafer cover member showing the interface between the central window portion and the peripheral flange portion.

The elements of the invention are designated by a two digit reference numeral. The first digit indicates the Figure in which that element is first disclosed or is primarily described. The second digit indicates like features and structures throughout the Figures. Some reference numerals are followed by a letter which indicates a sub-portion or feature of that element.

GENERAL SYSTEM (FIG. 1)

Thermal reactor 10 is formed by reactor vessel 10V, defining a wafer reactor chamber 10C with a wafer cover member 12 mounted over an upper heating port, and a susceptor access member 13 mounted over a lower heating port. A suitable source of heat such as external radiant lamps 10L provide infra-red radiant heat into the chamber through members 12 and 13 which are transparent. The wafer cover member has a central window portion 12W which passes the heating radiations, and a peripheral flange portion 12F for supporting the central window. The flange is removably captured between base plate 14B formed in the side wall of the vessel, and clamping plate 14C secured to the base plate by a suitable clamping means such as locking bolts 14L.

The wafer cover member is resiliently supported between the plates by a suitable cushioning material such as base sealing O-ring 15B between the base plate and the flange, and clamp sealing O-ring 15C between the clamping plate and the flange. The O-rings are preloaded by the clamping bolts to provide a double seal for preventing the reactant processing gas within the chamber from escaping into the ambient environment. Susceptor access member 13 has a window portion 13W and a flange portion 13F, which is similarly mounted between a base plate 16B and a clamping plate 16C with locking bolts 16L and O-rings 17B and 17C.

The processing gas enters the chamber at supply port 10S as indicated by arrow S, and is leaves the chamber at exit port 10E as indicated by arrow E. Reduced pressure of the gas within the chamber is maintained by metering at the supply port to limit the supply flow S, and by evacuation pumping at the exit port to extract the exit flow E.

Semiconductor wafer 18 is placed on top of a suitable support platform within the chamber such as susceptor 18S for exposure to the flow of the reactant processing gas. The wafer may be rotated during processing for more uniform heating and deposition. The susceptor is secured to the upper end of a drive shaft 18D which extends through access member 13 for rotation by susceptor driver motor 18M. The drive shaft is sealed against the access member 13 by a suitable resilient structure such as double gasket rings 18G.

QUARTZ COVER MEMBER (FIG. 2A 2B)

Central window 12W has a slight outward bow forming a slightly convex outside or lamp-side surface 22L and a slightly concave inside or wafer-side surface 22W. The window may be cooled by a convection flow indicated by arrow 10F across the outside surface to prevent unwanted deposition of reactant material on the inside surface. The outward bow of the window is flat enough to promote the orderly flow of reactant gas and the uniform deposition of the reactant material. The outward bow is curved enough to oppose the compressive force of the ambient pressure against the reduced internal pressure during wafer processing. Thermal compensation of the window by radial confinement enhances the outward bow as the operating temperature of the reactor vessel increases to further oppose the ambient pressure. The wafer cover member is suitable for both reduced pressure and ambient pressure applications.

Figure 2B:
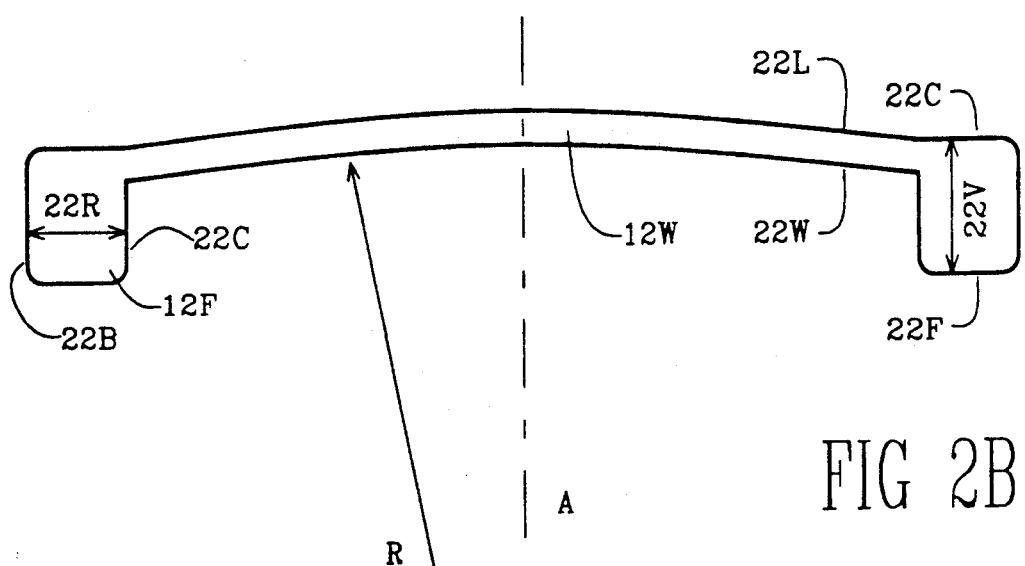
FIG. 2B is a side sectional view of the wafer cover member of FIG. 2A.

Peripheral flange 12F engages central window 12W around the circumference along support interface 22S for supporting the window in the reactor and confining the thermal expansion of the window. The flange extends radially outward from the interface (dimension 22R) between inner or chamber face 22C and outer or base face 22B. The flange extends vertically (dimension 22V) between bottom face 22F and top or cover face 22C. The mass of the flange material provides a rigid peripheral body which opposes and limits thermal expansion of the window material. The flange is round and generally symmetrical about a center axis A. In the embodiment of FIG. 2A, the window is shown as having a generally circular periphery. The outward curve of the bow is preferably also radially symmetrical about the center axis. In the embodiment of FIG. 2B, the outward curve of the window is shown as spherical, formed by a section of a sphere having a center C along the axis and a large radius of curvature R.

PRESSURE-THERMAL COMPENSATION

The quartz material of the central window is generally transparent to the direct radiations from the infrared heat lamps which pass through the window into the chamber without significant absorption. However, some of the lower frequency energy re-radiated from the heated wafer and susceptor pass into the window quartz with significant absorption by the window material. These re-radiations generate heat within the window producing thermal expansion forces. The peripheral flange remains cooler than the central window, and radially confines the window, forcing the window to bow outward beyond the initial room temperature bow. The window is thin and has sufficient flexibility to accommodate the enhanced bowing. The flange is thick and has sufficient rigidity to confine the window. As a result, the thermal expansion forces within the window are expressed as thermal compensation bowing. In the embodiment of FIG. 1, the outer face 22B of the flange is spaced from the inner edge of the base plate and clamping plate. The circumferential space 14S therebetween permits limited radial expansion of the flange.

The thermal compensation bow of the window increases as the reactor vessel temperature increases. That is, the room temperature bow is less than the enhanced high temperature bow. If preferred, during startup of the vessel, the reactor vessel may be "fired up" as the chamber pressure is "pumped down". The thermal bowing develops as the differential pressure increases. Coordinating temperature change with chamber pressure change minimizes internal stress. That is, simultaneously raising (or lowering) the temperature with as the chamber pressure is reduced (or increased) permits the window to reach operating (or room) temperature and pressure with minimum internal stress.

A radius of curvature of 35 inches (90 cm) plus or minus 10 inches (26 cm) provides sufficient bow to withstand window pressure differentials between zero and one atmosphere at wafer temperatures between room temperature and temperatures in excess or 1200 degrees C. That is, the window may function in any of the following pressure-temperature situations:

1) ambient chamber pressure and elevated wafer temperature - low pressure differential applications involving only a "thermal load"

2) or zero chamber pressure and elevated wafer temperature - high pressure differential applications involving both a "thermal load" and a "pressure load"

3) or ambient chamber pressure and ambient wafer temperature - temporary no load start-up condition 4) or zero chamber pressure differential and ambient wafer temperature - temporary start-up condition.

Figure 2C:
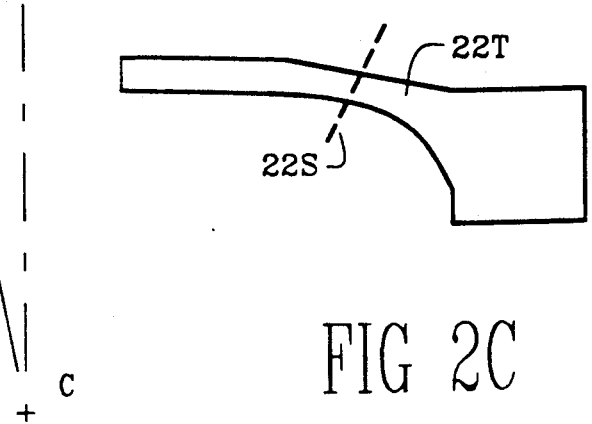
FIG. 2C is an enlarged fragmentary sectional view of the interface and a dimensional transition portion of the wafer cover member of FIG. 2B.

The thermal load and pressure load produce internal stresses within the quartz which appear along dimensional transition portion 22T in the flange adjacent to interface 22S as shown in the embodiment of FIG. 2C. Stress risers are minimized within the transition portion by the smooth and gradual change from the thinness of the central window to the bulk of the flange.

The transition portion does not include interface 22S which has the same curve and thickness on the flange side as on the window side. The flange is contoured to match the window along the interface for reducing interface stress. The curve of top face 22F along the transition region generally matches the curve of outside surface 22L of the window. Also, the curve of bottom face 22F along the transition region matches the curve of inside surface 22W of the window. The thickness of the flange at the interface is generally the same as the thickness of the window minimize dimensional discontinuity and reduce the associated stress riser.

Anderson et al does not teach the same pressure-thermal compensation as the present invention. The opposed quartz covers of Anderson do not teach enhanced bowing at elevated temperatures. Adams et al (U.S. Pat. No. 4,920,918) teaches an elongated quartz chamber with flanges extending from the two long sides. The sides of the chamber do not have flanges and therefore can not confine the central window to produce compensation bowing along the long dimension. Further, the chamber has reinforcing ribs or gussets extending between the flanges which prevent compensation bowing in the short dimension.

COOLER FLANGE

The radial confinement and bow enhancement of the window during heating is provided by the rigidity of flange which is maintained at a lower operating temperature than the window. The flange remains cooler than the window for design and material reasons such as:

The flange is positioned further from the heat lamps 10L and outside of the center region of more intense infra-red radiations.

The top of the flange is covered by clamping plate 14C which shields the flange from direct radiations.

The flange may be opaque which prevents radiations from penetrating into the interior of the flange material, and minimizes the transfer of radiant heating energy into the flange and the sealing O-rings.

The flange has a high thermal mass and is therefore slower to heat then the window.

The window has a small cross section which can support minimal heat flow across the window to the interface.

The interface between the flange and the window has a small cross section and transfers minimal heat from the hot window to the cooler flange.

The flange has a large cross section, dimensions R and V, and conducts maximum heat flow out of the flange to the surrounding reactor vessel.

The intimate contact between the resilient O-rings and the flange faces promotes heat transfer to the base plate and clamping plate.

The vessel material is cooled and extracts heat from the flange. The reactor vessel has interior flow channels 10W for receiving a suitable cooling medium.

FLANGE HOOP EMBODIMENT (FIG. 3)

The peripheral flange may be encompassed by a reinforcing structure to enhance the confinement of the central window. In the embodiment of FIG. 3, hoop 32H formed of a suitably rigid, corrosion resistant material such as austenitic stainless steel, engages outer face 32B of flange 32F. As the central window increases in temperature, the outward force of thermal expansion is confined by the rigid property of the flange. The hoop adds to the rigidness and thermal mass of the flange for further confining the central window. In addition, the hoop restricts thermal expansion within the flange material. The flange remains cooler than the window and has less thermal expansion. However the flange does have a limited rise in temperature during operation and generates limited thermal expansion forces. Cooling channel 32W circulates a suitable fluid coolant such as cooling water or cooling gas throughout the hoop for removing heat from the hoop.

INCREASED MASS EMBODIMENT (FIG. 4)

If desired, the mass and rigidness of the flange may be increased by the addition of flange material. Additional flange portion 42A extends downwardly from the main flange portion 42F. The lower flange increases the height dimension of the flange. The added material further confines the central window against the thermal expansion load, and resists bending moments introduced into the flange by the pressure load.

FLUID COOLED CHANNEL (FIG. 5)

Cooling fluid may flow in the space between the base plate and the flange for removing heat from the flange. In the embodiment of FIG. 5, a pair of sealing O-rings 57 extending around the flange, are spaced to define a cooling channel 50W for circulating a suitable fluid coolant such as cooling water or cooling gas across the outer face 52B of flange 52F. In the embodiment of FIG. 5, the expansion force within the flange is restricted by the structure of the reactor vessel. The wall of base 54 encompasses the outer face of the flange and restricts the flange by pressure through the O-rings.

SPECIFIC EMBODIMENT

The following particulars of the wafer cover member and the reactor are given as an illustrative example of a specific embodiment. In this example,

---

Wafer Cover Member 12 diameter - 15.65" (40 cm)
made of clear fused silica quartz
Central Window 12 W diameter - 11.90" (28 cm)
radius of curvature - 37.5" (96 cm)
thickness - 4 mm
operating temperature inside surface
less than 600 degrees C.
Flange 42 F diameter - 15.65" (40 cm)
thickness R1 - 0.98" (2.5 cm)
thickness R2 - 0.90" (2.3 cm)
height V1 - 0.75" (1.9 cm)
height V2 - 0.66" (1.7 cm)
Susceptor 18 S temperature - 1150 degrees K.
Chamber pressure 80 torr

---

The values, dimensions, and material given above are not intended as defining the limitations of the invention. Numerous other applications and configurations are possible.

INDUSTRIAL APPLICABILITY

It will be apparent to those skilled in the art that the objects of this invention have been achieved as described hereinbefore by providing an improved window cover member for reactor vessels. The central window portion in the cover member has a flat bow suitable for both reduced pressure and ambient pressure applications. The window portion has pressure-thermal compensation due to the confining effect of the peripheral flange portion around the window portion.

CONCLUSION

Clearly various changes may be made in the structure and embodiments shown herein without departing from the concept of the invention. Further, features of the embodiments shown in the various Figures may be employed with the embodiments of the other Figures.

Therefore, the scope of the invention is to be determined by the terminology of the following claims and the legal equivalents thereof.

We claim as our invention:

1. A reactor for processing semiconductor wafers at an elevated temperature in a processing gas at a reduced pressure, comprising:
   reactor vessel having a wafer chamber for containing at least one semiconductor wafer during processing, and having a heating port through the reactor vessel to the chamber;
   radiant energy heating means outside of the reactor vessel for radiating energy through the heating port into the chamber to elevate the temperature of the wafer;
   gas means for introducing the processing gas into the chamber and for evacuating the processing gas from the chamber;
   cover member mounted over the heating port, having a central window portion and a peripheral flange portion;
   the central window portion formed of a material which is generally transparent to the radiant energy from the heating means for passing the radiant energy into the chamber, and having an outward bow defining a convex outside surface and a concave inside surface for opposing the compressive force created by the reduced pressure within the chamber; and
   the peripheral flange portion supporting the window portion, and for radially confining the window portion in response to thermal expansion within the window portion for enhancing the outward bow of the window portion.

2. The reactor of claim 1 wherein the material forming the central window portion is clear fused silica quartz.

3. The reactor of claim 2 wherein the heating radiations from the radiant heating means pass through the window quartz into the wafer chamber for heating the wafer without significant absorption by the window quartz, and the re-radiations from the heated wafer pass into the window quartz with significant absorption by the window quartz generating heat within the window quartz.

4. The reactor of claim 1 wherein the peripheral flange portion is rigid and radially confines thermal expansion within the window portion.

5. The reactor of claim 1 wherein the outward bow of the window portion is flat enough to support an orderly flow of processing gas, and bowed enough to oppose the compressive force created by the reduced pressure within the chamber.

6. The reactor of claim 1 further comprising a base means proximate the heating port for receiving the peripheral flange portion of the cover member.

7. The reactor of claim 6 wherein the cover member further comprises an additional flange portion extending from the peripheral flange portion toward the wafer chamber.

8. The reactor of claim 6 wherein the cover member further comprises a rigid hoop means around the peripheral flange portion for radially restricting expansion of the peripheral flange portion.

9. The reactor of claim 8 further comprising cooling means for circulating fluid coolant throughout the rigid hoop means for removing heat therefrom.

10. The reactor of claim 6 wherein the base means engages the peripheral flange portion and restricts radially expansion of the peripheral flange portion.

11. The reactor of claim 6 wherein the peripheral flange portion is cooler than the window portion during processing and radially confines thermal expansion within the window portion.

12. The reactor of claim 11 further comprising a heat shield means between the radiant energy heating means and the peripheral flange portion for reducing direct heating of the peripheral flange portion by the radiant energy heating means.

13. The reactor of claim 11 further comprising cooling means for circulating fluid coolant throughout the flange means for removing heat from the base means proximate the peripheral flange portion.

14. The reactor of claim 11 further comprising cooling means for circulating fluid coolant throughout the space between the base means and the flange means for removing heat.

15. A quartz cover member for mounting over the heating port in a semiconductor reactor vessel, comprising:
   a thin central window portion with a generally circular periphery and having an outward bow at room temperature defining a convex outside surface and a concave inside surface;
   a thick peripheral flange portion extending radially outward from the window portion forming an inner face and an outer face, and engaging the circular periphery of the window portion along the inner face to radially confine the window portion for enhancing the outward bow of the window portion in response to thermal expansion within the window portion: and
   an interface formed between the window portion and the flange portion.

16. The cover member of claim 15 further comprising a dimensional transition portion between the window portion and the flange portion, the transition portion being thin near the window portion and thick near the flange portion.

17. The cover member of claim 16 wherein:
   the thinness of the transition portion matches the thinness of the window portion at the interface with the window portion;
   the outside surface of the transition portion has the same curvature as the outside surface of the window portion at the interface with the window portion; and
   the inside surface of the transition portion has the same curvature as the inside surface of the window portion at the interface with the window portion.

18. The cover member of claim 15 wherein the flange portion and the window portion are generally symmetrical about a center axis through the cover member.

19. The cover member of claim 18 wherein the outward bow of the window portion is spherical with a large radius of curvature.

20. The cover member of claim 19 wherein the outward bow of the window portion is spherical with a radius of curvature 90 cm plus or minus 26 cm.

21. The cover member of claim 19 wherein the outward bow of the window portion is spherical with a radius of curvature of 96 cm.

22. A method of operating a reactor for processing semiconductor wafers, comprising the steps of:
placing at least one semiconductor wafer into a processing chamber in the reactor;
introducing a processing gas in the chamber;
reducing the pressure of the processing gas to a reduced pressure which is less than ambient pressure;
heating the chamber with radiant energy through a heating port in the reactor to elevate the temperature of the wafer and to elevate the temperature of an outwardly bowed transparent window over the heating port;
confining the thermal expansion of the window in a radial direction by means of a peripheral flange around the window; and
permitting the thermal expansion of the window in a transverse direction to enhance the outward bow of the window for opposing the inward compressive force created by the reduced pressure within the chamber.

23. The method of claim 22, comprising the additional step of maintaining the peripheral flange at an operating temperature less than the transparent window.

24. The method of claim 22, wherein the pressure of the processing gas is reduced simultaneously as the temperature of the window is elevated.

* * * * *